United States Patent
Kobayashi et al.

(10) Patent No.: US 7,861,421 B2
(45) Date of Patent: Jan. 4, 2011

(54) METHOD FOR MEASURING ROTATION ANGLE OF BONDED WAFER

(75) Inventors: Norihiro Kobayashi, Annaka (JP); Tohru Ishizuka, Annaka (JP); Nobuhiko Noto, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 12/452,070

(22) PCT Filed: Jul. 3, 2008

(86) PCT No.: PCT/JP2008/001752

§ 371 (c)(1), (2), (4) Date: Dec. 14, 2009

(87) PCT Pub. No.: WO2009/013857

PCT Pub. Date: Jan. 29, 2009

(65) Prior Publication Data

US 2010/0132205 A1 Jun. 3, 2010

(30) Foreign Application Priority Data

Jul. 25, 2007 (JP) .............................. 2007-193544

(51) Int. Cl.
*G01B 5/24* (2006.01)
*G01B 7/30* (2006.01)
(52) U.S. Cl. .......................................... 33/1 N; 33/706
(58) Field of Classification Search .................. 33/1 N, 33/1 PT, 706–708, 534
See application file for complete search history.

(56) References Cited

U.S. PATENT DOCUMENTS 7,057,259 B2 * 6/2006 Arikado et al. ............. 257/618

(Continued)

FOREIGN PATENT DOCUMENTS

JP    A-2002-134374    5/2002

(Continued)

OTHER PUBLICATIONS

International Search Report for International Application No. PCT/JP2008/001752, issued Oct. 7, 2008.

*Primary Examiner*—Yaritza Guadalupe-McCall
(74) *Attorney, Agent, or Firm*—Oliff & Berridge, PLC

(57) ABSTRACT

The present invention provides a method for measuring a rotation angle of a bonded wafer, wherein a base wafer and a bond wafer each having a notch indicative of a crystal orientation formed at an outer edge thereof are bonded to each other at a desired rotation angle by utilizing the notches, a profile of the bond wafer having a reduced film thickness is observed with respect to a bonded wafer manufactured by reducing a film thickness of the bond wafer, a positional direction of the notch of the bond wafer seen from a center of the bonded wafer is calculated by utilizing the profile, an angle formed between the calculated positional direction of the notch of the bond wafer and a positional direction of the notch of the base wafer is calculated, and a rotation angle of the base wafer and the bond wafer is measured. As a result, the method for measuring a rotation angle of a bonded wafer that enables accurately and easily measuring the rotation angle of the notches of the base wafer and the bond wafer in a bonded wafer manufacturing line can be provided.

8 Claims, 2 Drawing Sheets

U.S. PATENT DOCUMENTS

| | | | |
|---|---|---|---|
| 7,398,699 B2 * | 7/2008 | Itomi | 33/1 N |
| 7,458,164 B2 * | 12/2008 | Perret et al. | 33/1 PT |
| 2003/0003608 A1 * | 1/2003 | Arikado et al. | 438/14 |
| 2003/0094674 A1 | 5/2003 | Ipposhi et al. | |
| 2003/0169916 A1 | 9/2003 | Hayashi et al. | |
| 2006/0131696 A1 * | 6/2006 | Arikado et al. | 257/618 |

FOREIGN PATENT DOCUMENTS

| | | |
|---|---|---|
| JP | A-2003-139523 | 5/2003 |
| JP | A-2003-243465 | 8/2003 |
| JP | A-2006-128440 | 5/2006 |

* cited by examiner

[Fig. 1]
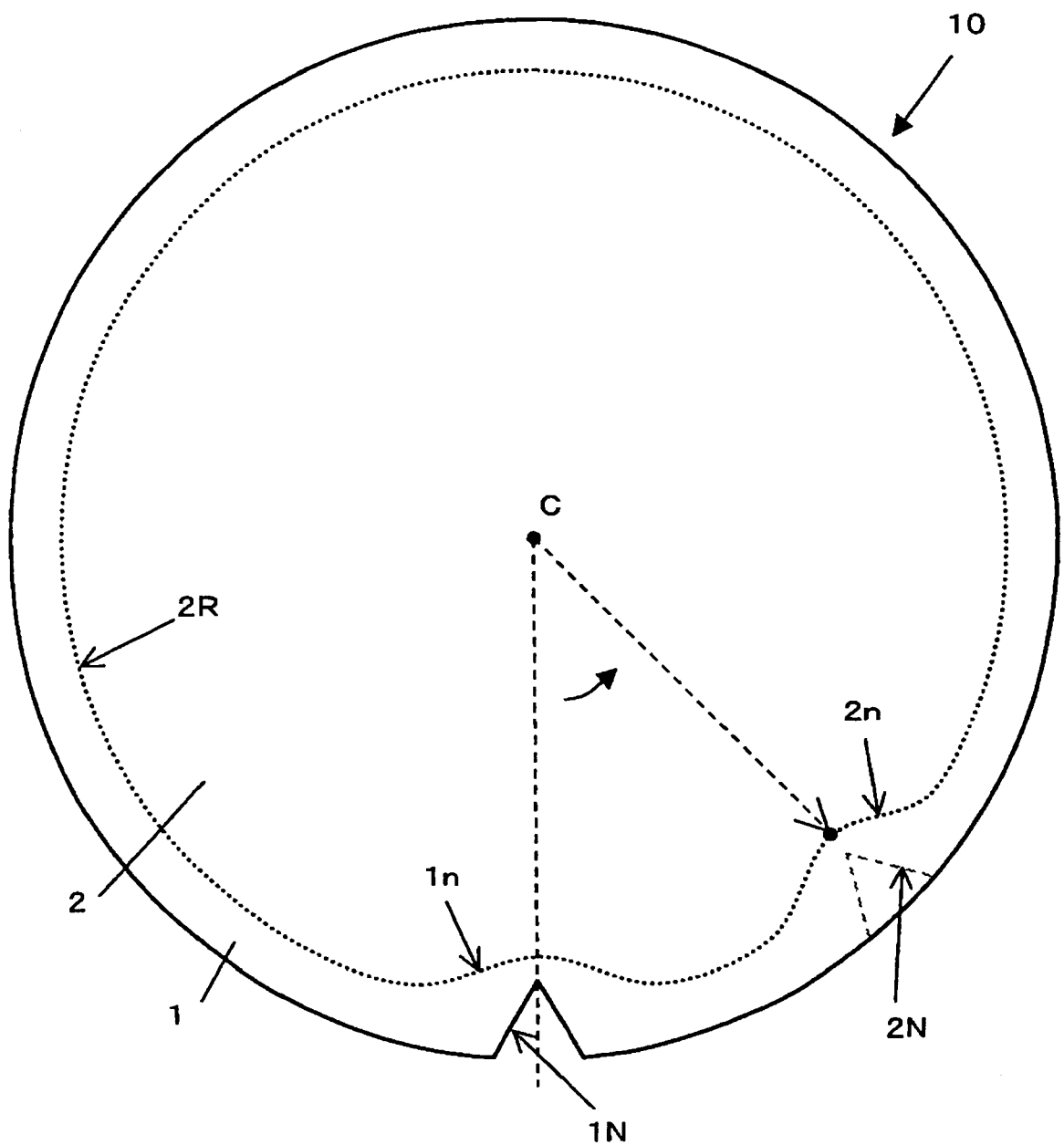

[Fig. 2]
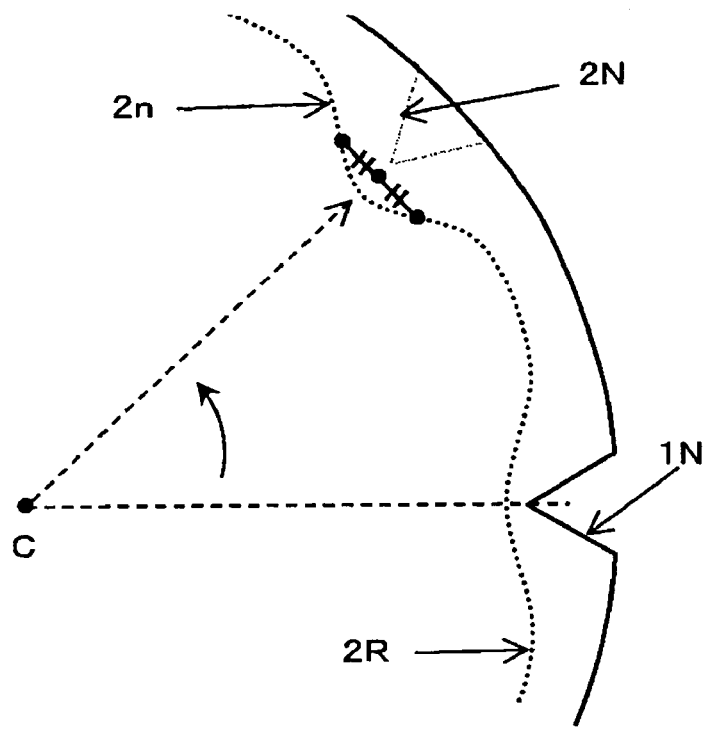
[Fig. 3]
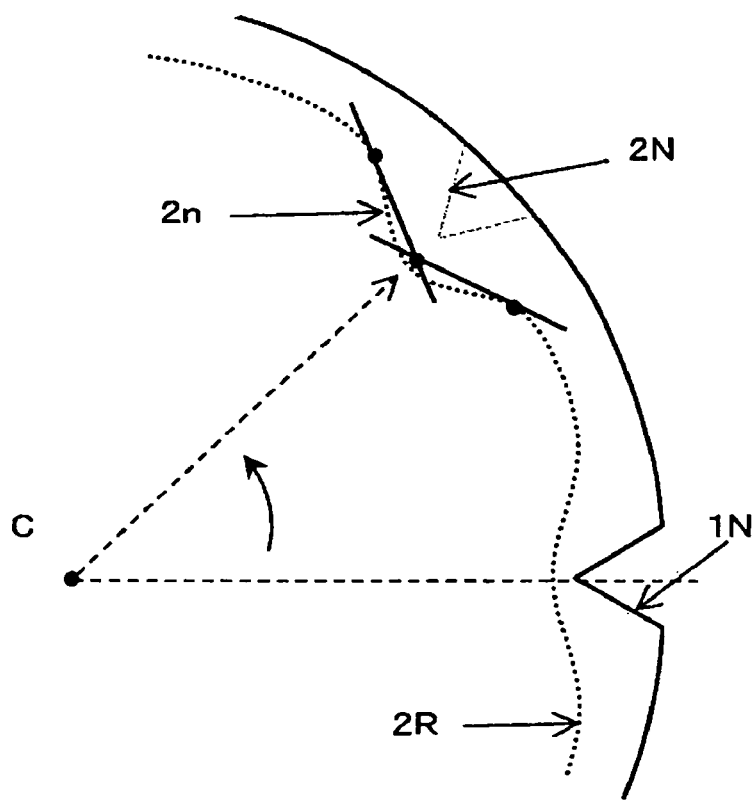

METHOD FOR MEASURING ROTATION ANGLE OF BONDED WAFER

TECHNICAL FIELD

The present invention relates to a method for measuring a bonded wafer obtained by bonding a base wafer and a bond wafer at a desired rotation angle by utilizing notches of the base wafer and the bond wafer, especially an SOI wafer manufactured by, e.g., an ion implantation delamination method.

BACKGROUND ART

As one of bonded wafers obtained by bonding two silicon wafers, there is an SOI (Silicon On Insulator) wafer. This SOI wafer is a bonded wafer having a silicon layer (which may be referred to as an SOI layer hereinafter) formed on a silicon oxide film as an insulator film, and has characteristics, e.g., a small parasitic capacitance or a high radiation resistance capability since the SOI layer in a substrate surface layer portion serving as a device fabrication region is electrically separated from the inside of a substrate through a buried insulator layer (a buried oxide film layer (a BOX layer)). Therefore, effects such as a high-speed/low-power consumption operation, software error prevention and others are expected, and this wafer appears promising as a substrate for a high-performance semiconductor device.

Such a bonded wafer, e.g., an SOI wafer is manufactured by forming a thermal oxide film on a surface of at least one of a bond wafer and a base wafer that are formed of, e.g., a silicon single crystal, then closely attaching the two wafers through the formed thermally oxide film, performing a bonding heat treatment to increase a bonding force, and thereafter reducing a film thickness of the bond wafer by grinding or mirror polishing to provide an SOI layer.

On the other hand, as a method for reducing a film thickness of a bond wafer, there is a method for reducing a film thickness of the bond wafer by previously forming an ion implanted layer consisting of, e.g., hydrogen ions on the bond wafer before bonding, bonding the bond wafer to a base wafer, and then effecting delamination at the ion implanted layer besides the method utilizing grinding/polishing. Since this ion implantation delamination method can reduce a film thickness of the SOI layer to be fabricated and provide the very excellent film thickness uniformity, it has been actively used.

When manufacturing the bonded wafer as explained above, an orientation flat (an OF) or a notch is formed at a wafer outer edge portion of each of a base wafer and a bond wafer to be formed in order to indicate a crystal orientation. This OF or notch is utilized as a positional reference for, e.g., mask matching in device manufacture. In particular, in a wafer having a diameter of 300 mm or above, a notch is formed often in recent years since an area to be ground is increased in case of the OF when performing cylindrical grinding with respect to an ingot fabricated by a Czochralski method.

Further, to improve device characteristics of, e.g., an MOS transistor, when manufacturing a bonded wafer that becomes a material, a bond wafer may be bonded to a base wafer in such a manner that a crystal orientation of the bond wafer matches with a device pattern. At this time, there is a technology that utilizes notches as indexes of the crystal orientations formed in the base wafer and the bond wafer to bond these wafers in such a manner that ends of the two notches match with each other or rotates the notches of the base wafer and the bond wafer a predetermined angle, e.g., 45 degrees to bond these wafers (see, e.g., Japanese Patent Application Laid-open No. 2002-134374).

However, even if the base wafer and the bond wafer are bonded to each other while adjusting a rotation angle of their notches in manufacture of the bonded wafer, the two wafers are not accurately bonded to each other in some cases. A typical example is a shift of a rotation angle, which is called a notch shift.

When a bonded wafer having a bond wafer attached thereto whose rotation angle deviates from a desired one enters a device manufacturing process, there is risk that the bonded wafer vary during, e.g., etching or pattern formation due to a difference in crystal orientation caused by a notch shift and its device characteristics change.

Such risk can be avoided as long as a rotation angle of a notch in each wafer can be measured after bonding and a bonded wafer having the notch shift can be specified to measure a shift amount of the rotation angle, but there is no method for accurately measuring the rotation angle of the notch of each of the base wafer and the bond wafer in a bonded wafer manufacturing line.

DISCLOSURE OF INVENTION

In view of the above-described problems, it is an object of the present invention to provide a method for measuring a rotation angle of a bonded wafer that can accurately and easily measure a rotation angle of a notch in each of a base wafer and a bond wafer in a bonded wafer manufacturing line.

To achieve this object, according to the present invention, there is provided a method for measuring a rotation angle of a bonded wafer by which at least a base wafer and a bond wafer each having a notch indicative of a crystal orientation formed at an outer edge thereof are bonded to each other at a desired rotation angle by utilizing the two notches and a rotation angle of the base wafer and the bond wafer in a bonded wafer manufactured by reducing a film thickness of the bond wafer is measured, the method including: observing a profile of the bond wafer having the reduced film thickness; calculating a positional direction of the notch of the bond wafer seen from a center of the bonded wafer by utilizing the observed profile of the bond wafer; calculating an angle formed between the calculated positional direction of the notch of the bond wafer and a positional direction of the notch of the base wafer; and measuring the rotation angle of the base wafer and the bond wafer.

As explained above, according to the present invention, the profile of the thinned bond wafer is observed, the observed profile of the bond wafer is utilized to calculate the positional direction of the notch of the bond wafer seen from the center of the bonded wafer, the angle formed between the calculated positional direction of the notch of the bond wafer and the positional direction of the notch of the base wafer is calculated, and the rotation angle of the base wafer and the bond wafer included in the bonded wafer is measured, thereby accurately and easily measuring the rotation angle of the base wafer and the bond wafer included in the bonded wafer based on the calculation only to observe the profile of the bond wafer in the bonded wafer manufacturing line.

Furthermore, since the rotation angle of the base wafer and the bond wafer included in the bonded wafer can be accurately measured in the bonded wafer manufacturing line like the present invention, a time required for measuring the rotation angle can be reduced, thus improving the productivity of the bonded wafer. Moreover, since the rotation angle of the base wafer and the bond wafer included in the bonded wafer can be accurately known, knowing the rotation angle of the notches leads to an improvement in characteristics and a production yield in device manufacture when using the manufactured bonded wafer in device manufacture.

In this case, it is preferable for the observation of the profile of the bond wafer having the reduced film thickness to use a particle counter.

When observing the profile of the thinned bond wafer in this manner, using the particle counter for this observation enables measuring particles of the bonded wafer and also measuring the rotation angle the base wafer and the bond wafer included in the bonded wafer after reducing the film thickness of the bond wafer, and hence reducing a time required for measuring the bonded wafer.

Additionally, when calculating the positional direction of the notch of the bond wafer, a positional direction along which a distance from the center of the bonded wafer to the profile of the bond wafer is minimum can be calculated as the positional direction of the notch of the bond wafer, two inflection points at which a convex shape changes to a concave shape in the profile of the bond wafer can be calculated and a positional direction of an intermediate point of the two inflection points seen from the center of the bonded wafer can be calculated as the positional direction of the notch of the bond wafer, or two tangential lines having the same distance from an intersection of each tangential line and the profile of the bond wafer to a contact point of each tangential line can be selected from tangential lines that are in contact with the profile of the bond wafer and a positional direction of an intersection of the two tangential lines seen from the center of the bonded wafer can be calculated as the positional direction of the notch of the bond wafer.

As explained above, at the time of calculating the positional direction of the notch of the bond wafer, the positional direction along which the distance from the center of the bonded wafer to the profile of the bond wafer is minimum is calculated as the positional direction of the notch of the bond wafer, two inflection points where the profile of the bond wafer changes from a convex shape to a concave shape are calculated to compute the positional direction of the intermediate point of the two inflection points see from the center of the bonded wafer as the positional direction of the notch of the bond wafer, or two tangential lines having the same distance from the intersection of the tangential line and the profile of the bond wafer to the contact point of the tangential line are selected from the tangential lines which are in contact with the profile of the bond wafer to calculate the positional direction of the intersection of the two tangential lines seen from the center of the bonded wafer as the positional direction of the notch of the bond wafer, thereby easily and accurately calculating the rotation angle of the base wafer and the bond wafer included in the bonded wafer.

The method for measuring a rotation angle of a bonded wafer according to the present invention enables accurately and easily measuring the rotation angle of the base wafer and the bond wafer in the bonded wafer manufacturing line, whereby the time required for measuring the rotation angle in manufacture of the bonded wafer can be reduced, resulting in an improvement of characteristics and a yield ratio in device manufacture.

BRIEF DESCRIPTION OF THE DRAWINGS

FIG. 1 is a view for explaining an embodiment of a method for measuring a rotation angle of a bonded wafer according to the present invention;

FIG. 2 is a view for explaining a method for calculating a positional direction of a notch of a bond wafer; and FIG. 3 is a view for explaining a method for calculating the positional direction of the notch of the bond wafer.

BEST MODE(S) FOR CARRYING OUT THE INVENTION

In a process of bonding a base wafer to a bond wafer in manufacture of a bonded wafer in a conventional example, the two wafers cannot be accurately bonded to each other at a desired position in some cases, and there is known a shift in an angular direction called a notch shift is known as one of such situations. Since the notch is an index for a crystal orientation of a wafer, when an angular direction deviates from the notch of the base wafer when the bond wafer is attached, bringing the bonded wafer having such notch shift into a device manufacturing process causes variations in, e.g., etching or device pattern formation because a crystal orientation is different from that of a bonded wafer having no notch shift, and desired device characteristics may not be possibly obtained. Therefore, an accurate rotation angle of the notch must be measured in order to avoid such a notch shift. Further, when the notch of the bond wafer is rotated from the notch of the base wafer an arbitrary angle to bond these wafers to each other, there is no method of accurately measuring the rotation angle of the bond wafer in the actual bonded wafer in line.

To solve such a problem, the present inventors have eagerly repeatedly conducted studies.

When manufacturing a bonded wafer, a polishing sag is present at an outer periphery of each of two mirror-polished wafers to be bonded, and this portion remains as an unbonded portion. When a reduction in film thickness is performed while the unbonded portion is present, the thinned bond wafer has a smaller diameter than the base wafer, and the notch portion of the bond wafer has a round end.

Although putting a bonded wafer as a rotation angle measurement target under an optical microscope having an XY stage and fixing the notch of the base wafer at a reference position to visually confirm a rotation angle of a position of the thus rounded notch of the bond wafer can be considered, this measurement cannot be added to a bonded wafer manufacturing line, a tremendous time is required even if the rotation angle of the bonded wafer is measured out of the line, and such a method is not realistic.

Therefore, even if measuring the rotation angle of the bond wafer and the base wafer after the film thickness reduction is tried, the measurement is difficult.

Thus, the present inventors have conceived of the idea that the rotation angle of the base wafer and the bond wafer included in the bonded wafer can be accurately measured if a positional direction of the notch end before having the rounded shape can be calculated from the rounded notch of the bond wafer after the film thickness reduction, and brought the method according to the present invention to completion, the method including the steps of observing a profile of the thinned bond wafer, utilizing the observed profile of the bond wafer to calculate the positional direction of the notch of the bond wafer seen from the center of the bonded wafer, and calculating an angle formed between the calculated positional direction of the notch of the bond wafer and the positional direction of the notch of the base wafer to measure the rotation angle of the base wafer and the bond wafer.

Although an embodiment according to the present invention will now be described hereinafter with reference to the drawings, the present invention is not restricted thereto.

FIG. 1 is a view for explaining an embodiment of a rotation angle of a bonded wafer according to the present invention.

In the following explanation, for example, a positional direction of a notch means a direction of a notch seen from a center C of a bonded wafer 10. Further, although a coordinate system that specifies a position is not restricted, a rotation angle can be easily measured by, e.g., performing a calculation using polar coordinates.

First, the bonded wafer 10 as a rotation angle measurement target includes a base wafer 1 and a bond wafer 2 formed of, e.g., silicon, and notches 1N and 2N indicative of the same crystal orientation <110> are formed at outer edges of these two wafers. Furthermore, the base wafer 1 and the bond wafer 2 are bonded in such a manner that an angle formed at the center of the bonded wafer becomes, e.g., 0° or 45° by utilizing the two notches 1N and 2N, and a film thickness of the bond wafer is reduced based on an ion implantation delamination method, thereby producing the bonded wafer (FIG. 1 shows an example where the wafers are rotated 45° and bonded).

Moreover, when the film thickness of the bond wafer 2 is reduced based on the ion implantation delamination method, the notch 2N of the bond wafer has a rounded notch end as shown in FIG. 1 (2n).

Additionally, an unbonded portion based on the notch 1N of the base wafer is formed in the bond wafer by the film thickness reduction of the bond wafer 2 as shown in FIG. 1 (1n).

The notch 1N of the base wafer serves as a reference notch 1N of the bonded wafer 10 itself after the film thickness reduction of the bond wafer.

To measure a rotation angle of the baser wafer 1 and the bond wafer 2 included in the thus manufactured wafer 10, a profile 2R of the thinned bond wafer 2 is first observed.

Although an observation apparatus utilized at this time is not restricted in particular as long as it enables observing the profile 2R of the thinned bond wafer, a new apparatus that is used for measuring the rotation angle does not have to be introduced by utilizing a measurement apparatus that is used for other measurements in the manufacture line of the bonded wafer 10. Therefore, a wafer surface inspection apparatus using a laser beam or the like is preferably adopted.

In particular, as an optimum apparatus having the above-described conditions, using a particle counter (not shown) is desirable.

When observing the profile 2R of the thinned bond wafer in this manner, particles of the bonded wafer 10 can be measured after the film thickness reduction of the bond wafer 2 and the rotation angle of the base wafer 1 and the bond wafer 2 included in the bonded wafer can be measured by utilizing the particle counter for the observation, thereby reducing a time required for measuring the rotation angle of the bonded wafer.

It is to be noted that, when observing the profile 2R of the bond wafer, the profile of the bond wafer does not have to be seen in a usual setting, and hence a viewing field range of the particle counter is taken in a minimal range. However, like the present invention, to observe the profile 2R of the bond wafer, the observation viewing field range of the particle counter can be expanded to the range that the profile of the bond wafer can be observed. In this case, the entire profile of the bond wafer does not have to be observed, and enabling seeing at least the profile of the notch 2n can suffice.

A positional direction of the notch 2N of the bond wafer seen from the center C of the bonded wafer 10 is calculated by utilizing the observed profile 2R of the bond wafer.

To measure the rotation angle of the bond wafer 2 from the base wafer 1, enabling knowing a direction along which the end of the notch 2N of the bond wafer before the film thickness reduction is present can suffice, but the notch 2N of the bond wafer becomes as shown in FIG. 1 when reducing the film thickness (2n). Therefore, in the present invention, a positional direction of the end of the notch 2N of the bond wafer before the film thickness reduction is calculated from the rounded notch 2n.

A position of the notch 1N of the base wafer is adapted for a notch positioning function of an apparatus (not shown) that is utilized when observing the profile 2R of the bond wafer, whereby a coordinate system of the bonded wafer is fixed. In case of polar coordinates, the end of the notch 1N of the base wafer can be determined as a reference to set the center C of the bonded wafer 10 as an original point.

As specific methods for calculating a positional direction of the notch 2N of the bond wafer, there are the following three methods.

According to a first one of such methods, as shown in FIG. 1, a position at which a distance from the center C of the bonded wafer 10 to the profile 2R of the bond wafer is minimum on the profile 2R of the bond wafer is found, and a direction of this position is calculated as a positional direction of the notch 2N of the bond wafer.

This calculation can be automatically and easily executed by a calculating apparatus (not shown) connected with the measurement apparatus, e.g., the particle counter.

According to a second one of the methods for calculating a positional direction of the notch 2N of the bond wafer, a calculation can be effected as shown in FIG. 2. FIG. 2 is a view for explaining the method for calculating a positional direction of the notch of this bond wafer.

First, two inflection points at which a convex shape changes to a concave shape are calculated in the round notch 2n on the profile 2R of the bond wafer formed by the notch 2N of the bond wafer are calculated. Further, an intermediate point of the two inflection points is taken, and a positional direction of the intermediate point of the two inflection points seen from the center C of the bonded wafer is calculated as a positional direction of the notch 2N of the bond wafer.

According to a third one of the methods for calculating a positional direction of the notch 2N of the bond wafer, a calculation can be executed as shown in FIG. 3. FIG. 3 is a view for explaining the method for calculating a positional direction of the notch of the bond wafer.

First, two tangential lines that have the same distance from an intersection of each tangential line and the profile of the bond wafer to a contact point of each tangential line are selected from tangential lines that are in contact with the profile 2R of the bond wafer. Furthermore, an intersection of the two tangential lines is taken, and a positional direction of the intersection of the two tangential lines seen from the center C of the bonded wafer is calculated as a positional direction of the notch 2N of the bond wafer.

Then, an angle formed between the positional direction of the notch 2N of the bond wafer calculated by any one of the above-described methods and the positional direction of the notch 1N of the base wafer at the center C of the bonded wafer 10 is calculated. When the end of the notch 1N of the base wafer is determined as a reference in the polar coordinates, the positional direction of the notch 2N of the bond wafer based on the calculation is a rotation angle as it is.

In this manner, the rotation angle of the base wafer 1 and the bond wafer 2 in the bonded wafer 10 can be measured.

According to the above-explained method for measuring the rotation angle of the bonded wafer, the rotation angle of the notch of each of the base wafer and the bond wafer can be accurately and easily measured in a bonded wafer manufacturing line without spending a new measurement time.

It is to be noted that the example where the bond wafer is rotated 45° from the notch of the base wafer has been explained in this embodiment, but a notch $1n$ formed in the bond wafer by the notch of the base wafer is also observed in this case. However, since a positional direction of the notch $1n$ formed in the bond wafer 2 by the notch 1N of this base wafer coincides with a positional direction of the notch 1N of the base wafer, and hence this measured value can be excluded. Moreover, the rotation angle is not restricted to 45°, and any angle of 0° to 360° can be measured by the present invention.

Although the present invention will now be described in more detail hereinafter with reference to examples of the present invention, the present invention is not restricted thereto.

Example 1

An SOI wafer having an arbitrarily rotated notch was fabricated by the ion implantation delamination method, and a rotation angle of an SOI layer (a thinned bond wafer) and a base wafer of the SOI wafer was measured.

<Manufacture of SOI Wafer to be Measured>

As a material of the SOI wafer, a bond wafer and a base wafer each consisting of a silicon single crystal having a diameter of 300 mm were prepared. An oxide film was formed on the bond wafer by thermal oxidation, hydrogen ions were implanted, and the bond wafer was bonded to the base wafer.

At the time of this bonding, a notch of the bond wafer was rotated 45° in a clockwise direction with respect to a notch of the base wafer, and the bond wafer was bonded to the baser wafer.

Then, a delamination heat treatment was performed to the bonded wafers to effect delamination, and thereafter a sacrificial oxidation treatment was carried out to manufacture three SOI wafers each having an SOI layer with an adjusted film thickness.

<Measurement of Rotation Angle of Bond Wafer with Respect to Base Wafer>

To observe a profile of the SOI layer (the tinned bond wafer), a particle counter was used for performing observation. The adopted particle counter was SPT (manufactured by KLA Tencor Corporation) and used for observing a profile of the SOI layer with the range of an observation viewing field, i.e., an excluded region setting being set to 1 mm at the periphery and a notch of the SOI wafer (the notch of the base wafer) being fixed to a positioning mechanism.

Then, to determine coordinates by utilizing data of the profile of the SOI layer observed by the particle counter, a center C of each bonded wafer was determined as an original point (0,0), and an end position of a notch 1N of the bonded wafer was determined as a reference for an angle $\theta=0°$ of polar coordinates.

Additionally, one point on the profile of the SOI layer where a distance from the center of the SOI wafer to the profile of the SOI layer is minimum was selected. A direction of polar coordinates of the selected one point was regarded and calculated as a positional direction of the notch end of the bond wafer before the film thickness reduction, and a rotation angle of the notch of the bond wafer and the notch of the base wafer was calculated.

The following table 1 shows a result of performing the same measurement with respect to a total of three SOI wafers.

Example 2

Measurement of Rotation Angle of Bond Wafer with Respect to Base Wafer

To measure each SOI wafer fabricated in Example 1 by the second method, data of the profile of the SOI layer observed by the particle counter in Example 1 was utilized.

First, to determine coordinates, a center C of each bonded wafer was determined as an original point (0,0), and an end position of a notch 1N of the bonded wafer was determined as a reference for an angle $\theta=0°$ of polar coordinates.

Then, two inflection points where a convex shape changes into a concave shape of a rounded notch of the SOI layer formed by a notch 2N of a bond wafer were selected in the profile of the SOI layer, polar coordinates of positions of these two points were obtained, and polar coordinates of an intermediate point of these two points were calculated. Further, a positional direction of the intermediate point of the two inflection points was regarded and calculated as a positional direction of the notch of the bond wafer, and a rotation angle of the notch of the bond wafer and the notch of the base wafer was calculated.

The following table 1 shows a result of effecting the same measurement with respect to a total of three SOI wafers.

Example 3

To measure each SOI wafer fabricated in Example 1 by the third method, data of the profile of the SOI layer observed by the particle counter in Example 1 was utilized.

First, to determine coordinates, a center C of each bonded wafer was determined as an original point (0,0), and an end position of a notch 1N of the bonded wafer was determined as a reference for an angle $\theta=0°$ of polar coordinates.

Then, in the profile of the SOI layer, two tangential lines having the same distance from a contact point of each tangential line to an intersection of each tangential line and the profile of the SOI layer were selected from unnumbered tangential lines that can be drawn with respect to this profile. Further, polar coordinates of an intersection of the selected two tangential lines were obtained. A positional direction of the two tangential lines was regarded and calculated as a positional direction of the notch 2N of the bond wafer, and a rotation angle of the notch of the bond wafer and the notch of the base wafer was calculated.

The following Table 1 shows a result of effecting the same measurement with respect to a total of three SOI wafers.

Comparative Example

For comparison, the three SOI wafers measured in the examples were put under an optical microscope having an XY stage, and a rotation angle of the notch of the bond wafer with respect to the notch of the base wafer was manually measured. Table 1 shows this result together with the results of the examples.

TABLE 1

|  | 1st wafer | 2nd wafer | 3rd wafer |
| --- | --- | --- | --- |
| Example 1 Particle counter (minimum distance) | 44.928° | 45.169° | 45.923° |
| Example 2 Particle counter (intermediate point of inflection points) | 44.930° | 45.170° | 45.925° |

TABLE 1-continued

|  | 1st wafer | 2nd wafer | 3rd wafer |
|---|---|---|---|
| Example 3<br>Particle counter<br>(intersection of<br>tangential lines) | 44.926° | 45.172° | 45.923° |
| Comparative Example<br>Microscope with XY stage<br>(visual confirmation) | 44.933° | 45.166° | 45.927° |

As a result of each of Examples 1 to 3 and Comparative Example, substantially the same value is calculated as the rotation angle by the measurement method using the optical microscope having the XY stage, and hence it can be considered that the correct values can be obtained by all the measurement methods using the particle counter. Consequently, it can be understood that the measurement using the optical microscope requires a long time for adjustment and measurement and has a poor measurement efficiency but the method for measuring the rotation angle of the bonded wafer according to the present invention enables accurately, easily, and rapidly measuring the rotation angle of the notch of each of the base wafer and the bond wafer in the bonded wafer manufacturing line.

Although the polar coordinates system was selected and calculated as the coordinate system in the above-described examples according to the present invention, the present invention is not restricted thereto, and the center C of the bonded wafer may be determined as an original point (0,0), and a position vector of a point to be obtained may be acquired to calculate an angle formed between the notch end of the base wafer and the notch end of the bond wafer at the center of the bonded wafer.

It is to be noted that the present invention is not restricted to the foregoing embodiment. The foregoing embodiment is just an exemplification, and any examples that have substantially the same configuration and demonstrate the same functions and effects as the technical concept described in claims of the present invention are included in the technical scope of the present invention.

The invention claimed is:

1. A method for measuring a rotation angle of a bonded wafer by which at least a base wafer and a bond wafer each having a notch indicative of a crystal orientation formed at an outer edge thereof are bonded to each other at a desired rotation angle by utilizing the two notches and a rotation angle of the base wafer and the bond wafer in a bonded wafer manufactured by reducing a film thickness of the bond wafer is measured, the method comprising:
observing a profile of the bond wafer having the reduced film thickness;
calculating a positional direction of the notch of the bond wafer seen from a center of the bonded wafer by utilizing the observed profile of the bond wafer;
calculating an angle formed between the calculated positional direction of the notch of the bond wafer and a positional direction of the notch of the base wafer; and
measuring the rotation angle of the base wafer and the bond wafer.

2. The method for measuring a rotation angle of a bonded wafer according to claim 1, wherein the observation of the profile of the bond wafer having the reduced film thickness uses a particle counter.

3. The method for measuring a rotation angle of a bonded wafer according to claim 2, wherein, when calculating the positional direction of the notch of the bond wafer, a positional direction along which a distance from the center of the bonded wafer to the profile of the bond wafer is minimum is calculated as the positional direction of the notch of the bond wafer.

4. The method for measuring a rotation angle of a bonded wafer according to claim 2, wherein, when calculating the positional direction of the notch of the bond wafer, two inflection points at which a convex shape changes to a concave shape in the profile of the bond wafer are calculated, and a positional direction of an intermediate point of the two inflection points seen from the center of the bonded wafer is calculated as the positional direction of the notch of the bond wafer.

5. The method for measuring a rotation angle of a bonded wafer according to claim 2, wherein, when calculating the positional direction of the notch of the bond wafer, two tangential lines having the same distance from an intersection of each tangential line and the profile of the bond wafer to a contact point of each tangential line are selected from tangential lines that are in contact with the profile of the bond wafer, and a positional direction of an intersection of the two tangential lines seen from the center of the bonded wafer is calculated as the positional direction of the notch of the bond wafer.

6. The method for measuring a rotation angle of a bonded wafer according to claim 1, wherein, when calculating the positional direction of the notch of the bond wafer, a positional direction along which a distance from the center of the bonded wafer to the profile of the bond wafer is minimum is calculated as the positional direction of the notch of the bond wafer.

7. The method for measuring a rotation angle of a bonded wafer according to claim 1, wherein, when calculating the positional direction of the notch of the bond wafer, two inflection points at which a convex shape changes to a concave shape in the profile of the bond wafer are calculated, and a positional direction of an intermediate point of the two inflection points seen from the center of the bonded wafer is calculated as the positional direction of the notch of the bond wafer.

8. The method for measuring a rotation angle of a bonded wafer according to claim 1, wherein, when calculating the positional direction of the notch of the bond wafer, two tangential lines having the same distance from an intersection of each tangential line and the profile of the bond wafer to a contact point of each tangential line are selected from tangential lines that are in contact with the profile of the bond wafer, and a positional direction of an intersection of the two tangential lines seen from the center of the bonded wafer is calculated as the positional direction of the notch of the bond wafer.

* * * * *